(12) United States Patent
Schraub et al.

(10) Patent No.: US 8,343,842 B2
(45) Date of Patent: Jan. 1, 2013

(54) METHOD FOR REDUCING PLASMA DISCHARGE DAMAGE DURING PROCESSING

(75) Inventors: David M. Schraub, Bastrop, TX (US); Terry A. Breeden, Cedar Creek, TX (US); James D. Legg, Austin, TX (US); Mehul D. Shroff, Austin, TX (US); Ruiqi Tian, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 14 days.

(21) Appl. No.: 13/077,434

(22) Filed: Mar. 31, 2011

(65) Prior Publication Data

US 2011/0179394 A1 Jul. 21, 2011

Related U.S. Application Data

(62) Division of application No. 12/125,856, filed on May 22, 2008, now Pat. No. 7,951,695.

(51) Int. Cl.
*H01L 21/331* (2006.01)
*H01L 21/8222* (2006.01)

(52) U.S. Cl. . 438/311; 438/197; 438/513; 257/E21.006; 257/E21.17; 257/E21.267; 257/E21.218; 257/E21.4

(58) Field of Classification Search .......... 438/311, 438/197, 513, 514, 680, 712; 257/E21.006, 257/E21.17, E21.218, E21.267, E21.4
See application file for complete search history.

(56) References Cited

U.S. PATENT DOCUMENTS

| | | |
|---|---|---|
| 5,271,972 A | 12/1993 | Kwok et al. |
| 6,072,227 A | 6/2000 | Yau et al. |
| 6,452,284 B1 | 9/2002 | Sheck |
| 6,521,302 B1 | 2/2003 | Campana-Schmitt et al. |
| 6,933,523 B2 | 8/2005 | Sheck |
| 7,951,695 B2 * | 5/2011 | Schraub et al. ............... 438/513 |
| 2007/0061768 A1 | 3/2007 | Travis et al. |
| 2007/0134921 A1 | 6/2007 | Tian et al. |

* cited by examiner

*Primary Examiner* — David Nhu
(74) *Attorney, Agent, or Firm* — Hamilton & Terrile, LLP; Michael Rocco Cannatti

(57) ABSTRACT

A semiconductor process and apparatus to provide a way to reduce plasma-induced damage by applying a patterned layer of photoresist which includes resist openings formed over the active circuit areas as well as additional resist openings formed over inactive areas in order to maintain the threshold coverage level to control the amount of resist coverage over a semiconductor structure so that the total amount of resist coverage is at or below a threshold coverage level. Where additional resist openings are required in order to maintain the threshold coverage level, these openings may be used to create additional charge dissipation structures for use in manufacturing the final structure.

6 Claims, 7 Drawing Sheets

METHOD FOR REDUCING PLASMA DISCHARGE DAMAGE DURING PROCESSING

CROSS-REFERENCE TO RELATED APPLICATIONS

This application is a divisional of application Ser. No. 12/125,856, filed May 22, 2008, now U.S. Pat. No. 7,951,695 which is incorporated herein by reference in its entirety.

BACKGROUND OF THE INVENTION

1. Field of the Invention

The present invention is directed in general to the field of semiconductor devices. In one aspect, the present invention relates to the use of plasma processes in the fabrication of integrated circuits.

2. Description of the Related Art

In the manufacture of integrated circuits, plasma processes are often used for deposition or etching of various material layers, including but not limited to plasma-enhanced chemical vapor deposition (PECVD), plasma-based etch and ash processes, and plasma-based implantation processes. While plasma processing offers many advantages to the fabrication of integrated circuits, there can be device damage caused by plasma processing, including deposition and etch processes. This type of problem can occur not only early in the manufacture (e.g., when substrate regions are being implanted), but also in subsequent stages of manufacture (e.g., when metal interconnect layers are being formed). Other plasma-related effects, such as plasma non-uniformity, can also create electric field gradients that lead to device damage. Accordingly, a need exists for an integrated circuit manufacturing process and apparatus which reduce plasma-induced damage in integrated circuit devices. Further limitations and disadvantages of conventional processes and technologies will become apparent to one of skill in the art after reviewing the remainder of the present application with reference to the drawings and detailed description which follow.

BRIEF DESCRIPTION OF THE DRAWINGS

The present invention may be understood, and its numerous objects, features and advantages obtained, when the following detailed description is considered in conjunction with the following drawings, in which.

Figure 1:
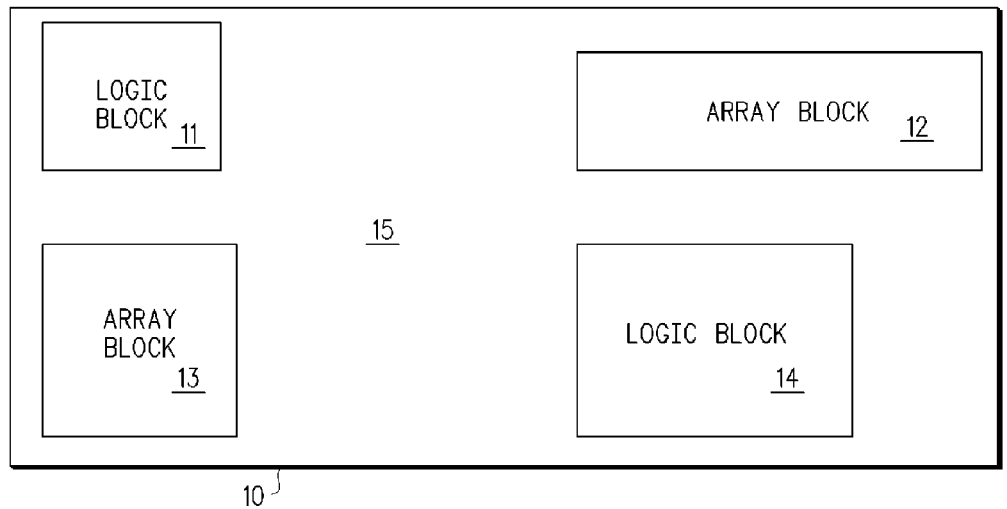
FIG. 1 is a schematic plan view of a semiconductor structure to show the layout of different active circuit areas that are separated from one another by inactive areas.

It will be appreciated that for simplicity and clarity of illustration, elements illustrated in the drawings have not necessarily been drawn to scale. For example, the dimensions of some of the elements are exaggerated relative to other elements for purposes of promoting and improving clarity and understanding. In addition, the number and relative size of the depicted masking pattern openings shown in the drawings are provided to illustrate the concepts disclosed herein, and it will be appreciated that additional specifics and details are set forth in the detailed description section. Further, where considered appropriate, reference numerals have been repeated among the drawings to represent corresponding or analogous elements.

DETAILED DESCRIPTION

A method and apparatus are described for reducing plasma-induced damage caused by plasma processes by applying photoresist patterns to control the amount of resist coverage over a semiconductor structure so that the total amount of resist coverage is at or below a threshold coverage level. In selected embodiments, electrostatic discharge damage from plasma processes (including but not limited to plasma-enhanced chemical vapor deposition (PECVD), plasma-based etch and ash processes, and plasma-based implantation processes) is reduced by maintaining the threshold coverage level no higher than 90-95 percent coverage. For example, during implant operations where there would ordinarily be a large amount of resist coverage and only small implant openings formed in the resist for the implantation, charge build-up on the resist is reduced by including additional resist openings so that the resist coverage is maintained at or below the threshold coverage level. In the front end processing, these openings may be used to create additional charge dissipation structures. For example, when patterning and etching a resist layer to expose implant substrate regions in the active circuit areas, additional resist openings are formed over the inactive areas so that any blanket implantation also implants substrate regions in the inactive areas. With these additional resist openings, the amount of open area in the device is increased, thereby reducing the chance of ESD discharge or surface build up charge. In addition or in the alternative, the implanted substrate regions in the inactive areas can help to funnel off the charge to prevent or reduce discharge in the active circuit area. Additional resist openings may also be used in the back end processing to create additional charge dissipation structures. For example, when patterning and etching an interlayer dielectric layer (or ashing a photoresist layer or patterning a metallic layer such as aluminum) in the course of forming a contact plug, metal layer or via structure as part of the active circuit elements, additional resist openings (or patterns) are formed over the inactive or active areas and used to define additional openings in which conductive tiling layers are formed in electrical contact with the doped regions formed in the inactive areas. By using additional resist openings (or patterns) during formation of the interconnect layers, the amount of open area in the device is increased, thereby reducing the chance of ESD discharge or surface build up charge. In addition or in the alternative, the additional conductive tiles formed over the inactive areas can help to funnel off the charge to prevent or reduce discharge in the active circuit area.

Various illustrative embodiments will now be described in detail with reference to the accompanying figures. While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are depicted with reference to simplified cross sectional drawings of a semiconductor device without including every device feature or geometry in order to avoid limiting or obscuring the present invention. It is also noted that, throughout this detailed description, certain materials will be formed and removed to fabricate the semiconductor structure. Where the specific procedures for forming or removing such materials are not detailed below, conventional techniques to one skilled in the art for growing, depositing, removing or otherwise forming such layers at appropriate thicknesses shall be intended. Such details are well known and not considered necessary to teach one skilled in the art of how to make or use the present invention.

In FIG. 1, there is shown a schematic plan view of a semiconductor structure 10 to show the layout of different active circuit areas 11-14 that are separated from one another by inactive areas 15. The surface of the semiconductor structure 10 is divided by a region of inactive areas 15 into a plurality of active circuit areas, including first and second logic blocks 11, 14, and first and second array blocks 12, 13. Though not shown in the plan view, it will be appreciated that tens of thousands of individual logic gates and other integrated circuit structures will be formed in each of the active circuit areas. In addition, any desired number of active circuit areas can be formed using any desired layout configuration, though in selected embodiments, the active circuit areas are separated from one another by inactive or inactive areas.

Figure 2:
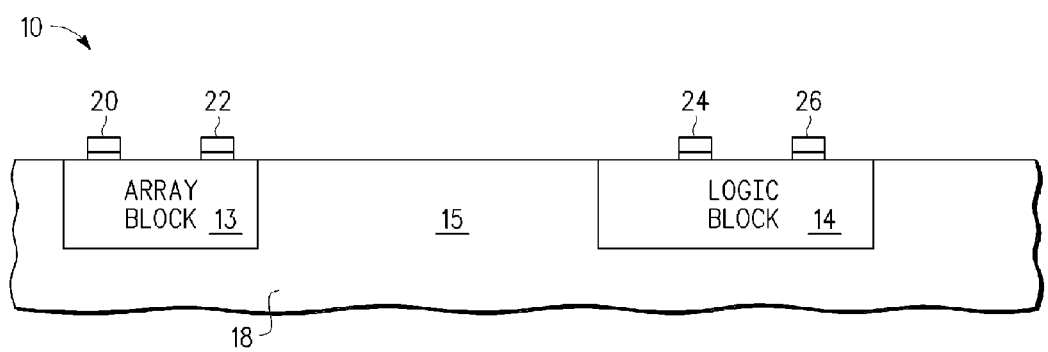
FIG. 2 is a partial cross-sectional view of the semiconductor structure depicted in FIG. 1 which depicts one or more etched semiconductor layers formed in the active circuit areas.

Turning now to FIG. 2, there is shown a partial cross-sectional view of the semiconductor structure 10 depicted in FIG. 1 which depicts one or more etched semiconductor layers 20, 22, 24, 26 formed in the active circuit areas 13, 14. Specifically, the semiconductor structure 10 includes a first semiconductor substrate layer 18 formed of a semiconductor material which may have any desired crystallographic orientation. Depending on the type of transistor device being fabricated, the first semiconductor substrate layer 18 may be implemented as a bulk silicon substrate, single crystalline silicon substrate (doped or undoped), semiconductor-on-insulator (SOI) substrate, or any semiconductor material including, for example, Si, SiC, SiGe, SiGeC, Ge, GaAs, InAs, InP as well as other Group III-V compound semiconductors or any combination thereof, and may optionally be formed as the bulk handling wafer. As will be appreciated, selected regions in the first semiconductor substrate layer 18 may be appropriately doped to provide n-type (electron) and p-type (hole) carriers. In the cross-sectional view of FIG. 2, two separate active circuit regions for the array block 13 and logic block 14 are shown as being separated from one another by the inactive area region 15. While the array block region 13 and logic block region 14 may each include one or more well regions formed in the semiconductor substrate layer 18, the block regions 13, 14 are shown to depict that distinct active circuit areas may be separately and distinctly formed in the semiconductor substrate layer 18.

At this stage of manufacture, the active circuit areas are partially formed to include etched gate stacks formed from one or more semiconductor layers 20, 22, 24, 26, though it will be appreciated that other polysilicon-based device features may be formed, such as polysilicon resistors, zener diodes or other specialized transistor gate features. For gate stacks formed by depositing a layer of polysilicon over a gate dielectric layer, any desired gate patterning and etch sequence may be used to form the etched gate stack structures 20, 22, 24, 26, including but not limited to photoresist trim, photoresist or a hard mask formation, hard mask etch (using the photoresist as a mask), anti-reflective coating (ARC) etch (using the remnant hard mask as a mask), pre-etch cleaning, oxide break through, main poly plasma etch, soft landing etch, poly clean overetch, and post-etch cleaning. For CMOS applications, the etched gate electrode structure 20 in the first or array block circuit area 13 may be used to form core PMOS transistors in the completed device, while the etched gate electrode structure 22 in the first circuit area 13 may be used to form core NMOS transistors in the completed device. Similarly, and the etched gate structure 26 in the second or logic block circuit area 14 may be used to form core PMOS transistors in the completed device, while the etched gate electrode structure 24 in the second circuit area 14 may be used to form core NMOS transistors in the completed device. Of course, the etched semiconductor layers 20, 22, 24, 26 may be used to form resistors or non-core transistors and devices in the completed device.

Figure 3:
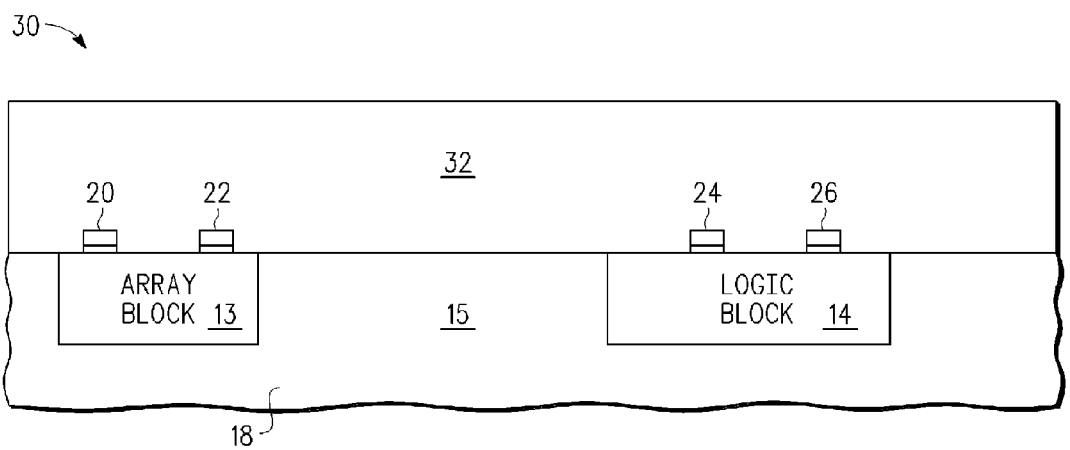
FIG. 3 illustrates processing subsequent to FIG. 2 after a first layer of photoresist is formed over the semiconductor structure.

FIG. 3 illustrates processing of the semiconductor structure 30 subsequent to FIG. 2 after a first photoresist layer 32 is formed to serve as an implant mask. While any desired resist formation process may be used, in an example implementation, the photoresist layer 32 may be formed by cleaning the semiconductor structure 30 and then depositing a layer 32 of photoresist material, such as a photo-sensitive polymer that is responsive to deep ultra-violet (DUV) light, over the semiconductor structure 30.

Figure 4:
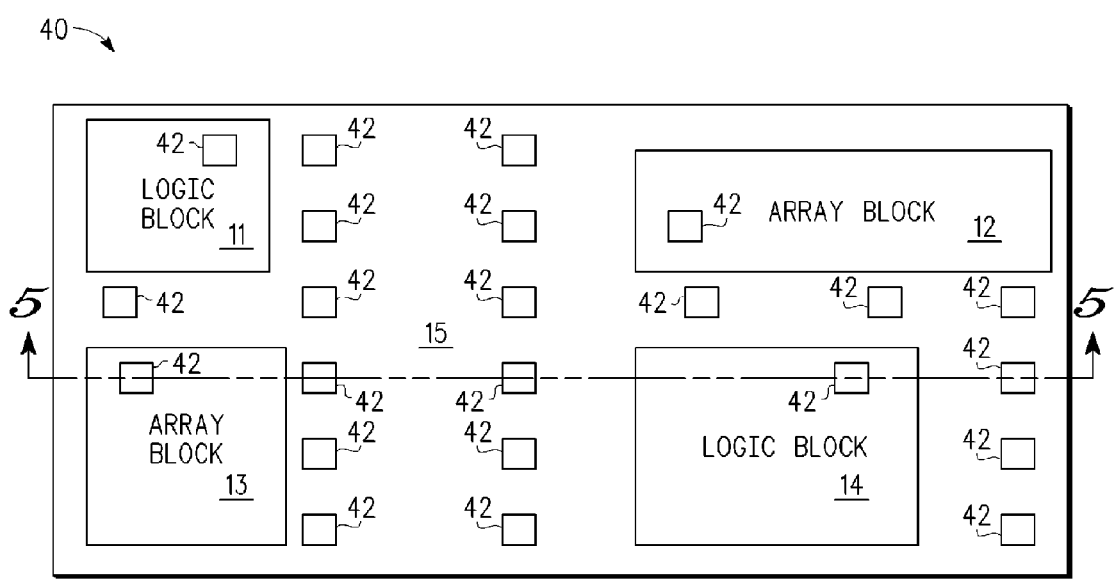
FIG. 4 is a schematic plan view illustrating processing subsequent to FIG. 3 after a first mask pattern is used to form a first plurality of resist openings over the active circuit areas and the inactive areas.

A mask having a desired design of clear and opaque areas may then be positioned atop the photoresist layer 32. This is depicted in FIG. 4 which shows a simplified schematic plan view illustrating processing of the semiconductor structure 40 subsequent to FIG. 3 after a first mask pattern is used to form a first plurality of resist openings 42 over the active circuit areas 11-14 and the inactive areas 15. Though the simplified plan view shows a single resist opening 42 being formed within each of the active circuit areas 11-14, it will be appreciated that fewer or additional resist openings may be formed in the active circuit areas 11-14. As for the resist openings 42 shown as formed over the inactive areas 15, the number and size of such openings is chosen to control the amount of resist coverage over the semiconductor structure 40 so that the total amount of resist coverage is at or below a threshold coverage level. In selected embodiments, the number and size of the resist openings over the inactive areas 15 is chosen so that the total open area from all resist openings 42 (over both active and inactive areas) represents at least ten percent of the total surface area of the semiconductor structure 40. In other words, the resist coverage over the semiconductor structure 40 is no higher than 90 percent coverage. However, different resist coverage percentages can be used to control which mask pattern is used to form the resist openings 42 over the active circuit areas 11-14 and the inactive areas 15. For example, improved discharge protection may be obtained by patterning resist openings 42 so that the total resist coverage over the semiconductor structure 40 is at or about 95 percent coverage. Whatever threshold coverage level is used, the number and size of the resist openings over the inactive areas 15 will depend on how many resist openings are formed over the active circuit areas 11-14. If only one resist opening is formed over the first logic block area 11, then additional resist openings will need to be formed over the inactive area 15 than would be the case if additional resist openings were formed over the active circuit areas 11-14. Finally, it will be appreciated that the resist openings 42 depicted in FIG. 4 are not intended to show an actual resist coverage percentage, but are instead provided for illustration purposes. In an actual implementation, thousands of resist openings 42 may need to be formed over the inactive area 15 in order to achieve the desired resist coverage percentage, depending on the number of resist openings required for the active circuit areas 11-14.

As described herein, selected embodiments of the present invention may create additional resist openings 42 over the inactive areas 15 for purposes of reducing the resist coverage and providing additional discharge paths. However, it will be appreciated that the additional resist openings may also be located over one or more of the active circuit areas 11-14, provided that appropriate protections are provided to prevent electrostatic discharge damage through any such additional resist openings. For example, if the resist layer is used during formation of one of the upper layers in the semiconductor structure, the additional resist openings may be formed over an active layer if the underlying semiconductor structure includes conductive tiles or lines that are connected to route any discharge from the active area to an inactive area. In addition, there may be inactive areas within a given circuit block over which or to which the additional openings are connected to safely route any electrostatic discharge. Stated more generally, an inactive area is any location within a die where charge dissipation may safely occur, whether located within an inactive area 15 between blocks 11-14, a street area on the perimeter of the die, or within a block.

Figure 5:
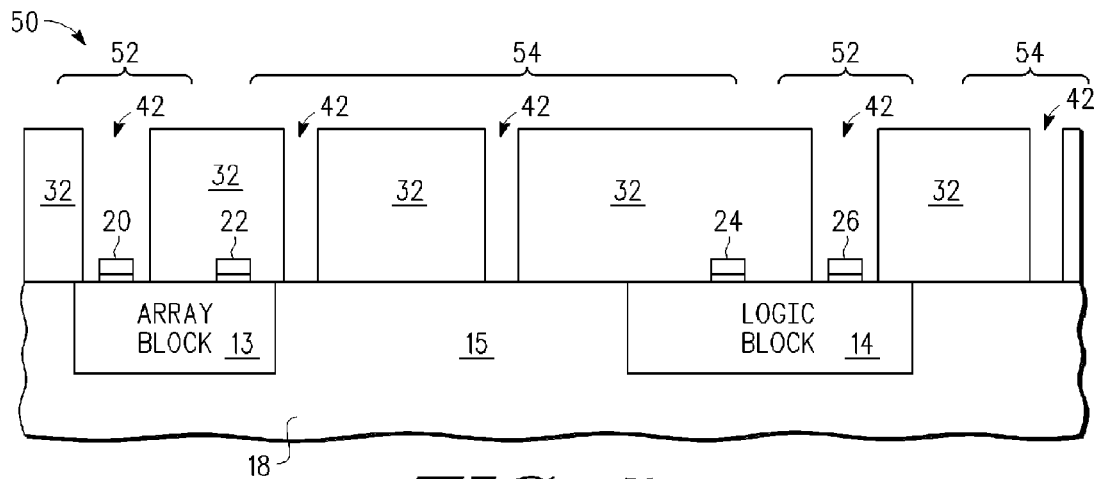
FIG. 5 is a partial cross-sectional view of the semiconductor structure depicted in FIG. 4 which shows how the first plurality of resist openings expose selected regions in the active circuit areas and in the inactive areas.

To illustrate a partial cross-sectional view of the semiconductor structure 40 from the vantage of the perspective line labeled "5," reference is now made to FIG. 5 which depicts a partial cross-sectional view of the semiconductor structure 50 to show how the first plurality of resist openings 42 expose selected regions in the active circuit areas 13, 14 and in the inactive areas 15. While any desired photolithography technique may be used, the resist openings 42 may be formed in the resist layer 32 by selectively exposing the photoresist layer 32 to ultra-violet light (e.g., DUV light) and the developing the resist layer to remove the portions of the resist layer. As formed, the resist openings 42 expose selected regions of the underlying substrate 18.

While any desired sequence of masking and implantation steps may be used to implant the gate, source and drain regions of the semiconductor structure 50, an illustrative sequence is described wherein the PMOS transistor features in the active circuit areas 13, 14 are selectively implanted with an initial source/drain implant, followed by selective implantation of the NMOS transistor features in the active circuit areas 13, 14. In particular, FIG. 5 depicts an implant mask with resist openings 42 for implanting the PMOS transistors which includes a first group of resist openings 52 that are formed over the active circuit areas in alignment with the intended implant regions associated with the etched PMOS gate electrode structures 20, 26. The patterned resist layer 32 also includes additional resist openings 54 formed over the inactive or inactive areas 15. These additional resist openings 54 increase the amount of open area in the resist layer, thereby reducing the buildup of surface charge on the resist layer 32. The additional resist openings 54 also reduce the chance of electrostatic discharge that would be caused by accumulation of charge on the resist layer during plasma-based etching of the resist. In particular, charge that accumulates on the patterned resist layer 32 is directed down the additional resist openings 54 where the charge dissipates into the underlying substrate 18, either directly or through a thin liner dielectric layer (not shown). And as the implant regions 64 are formed in the substrate 18 (as described below), they define a conductive path for routing or directing electrostatic discharge away from the active circuit areas.

Figure 6:
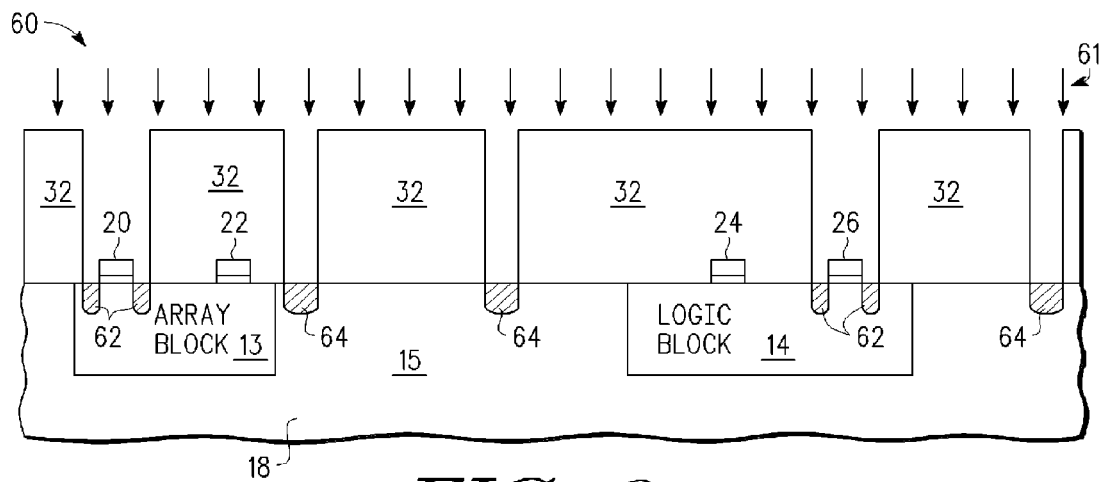
FIG. 6 illustrates processing subsequent to FIG. 5 where a first implant forms a first plurality of implant regions in the exposed selected regions.

With the patterned resist layer 32 in place, a first implantation process 61 simultaneously forms a first plurality of doped regions in the exposed selected regions, as shown in FIG. 6 which shows processing of the semiconductor structure 60 subsequent to FIG. 5. In particular, the first implant process 61 implants the source/drain regions 62 (e.g., halo regions and/or shallow extension regions) and gate electrode structures 20, 26 in the exposed first and second circuit areas 13, 14 using conventional implanting processes to implant ions having a predetermined conductivity type. Through not shown, there may be a thin implant oxide liner layer formed over the substrate and gate poly layers prior to implantation 61. For example, when PMOS transistors are fabricated in the first or second circuit areas 13, 14, the gate electrode structures 20, 26 and extension source/drain regions 62 are simultaneously implanted 61 with arsenic, though other dopants could be used, such as xenon or boron difluoride ($BF_2$). Though not shown, the initial source/drain implantation 61 may be used to implant the etched gate electrode structures 20, 26 and source/drain regions 62 in the active circuit areas 13, 14 through a thin sidewall spacer and/or liner oxide formed on the etched gate stack structures 20, 26 and exposed substrate regions. At the same time the source/drain regions 62 are implanted, the first implant process 61 implants the exposed regions 64 in the exposed inactive areas 15, thereby providing charge dissipation paths for any accumulated charge on the surface of the patterned resist layer 32.

In selected embodiments, instead of implanting the exposed regions 64 in the substrate 18, previous semiconductor processing steps may be used to form additional etched semiconductor features (such as one or more polysilicon lines) over the substrate layer 18 in the street area 15, where the additional semiconductor features (not shown) are positioned in alignment with the additional resist openings 42 in the street area 15. With such additional semiconductor features, the first implant process 61 implants the exposed additional semiconductor features in the exposed street areas 15, thereby forming a conductive path through which charge build up on the patterned resist layer 32 may be dissipated. Regardless of whether polysilicon lines are formed in alignment with the additional resist openings At this point in the fabrication process, the remnants of the first patterned resist layer 32 must be removed before performing additional processing. If a plasma-based etch or ash process is used to remove the resist layer 32, the presence of the additional resist openings 42 formed over the inactive area 15, as well as the exposed implanted regions 64, help reduce plasma-induced damage by reducing the total amount of resist coverage below a threshold coverage level, and otherwise providing additional charge dissipation structures for removing charge to prevent or reduce charge build-up.

Figure 7:
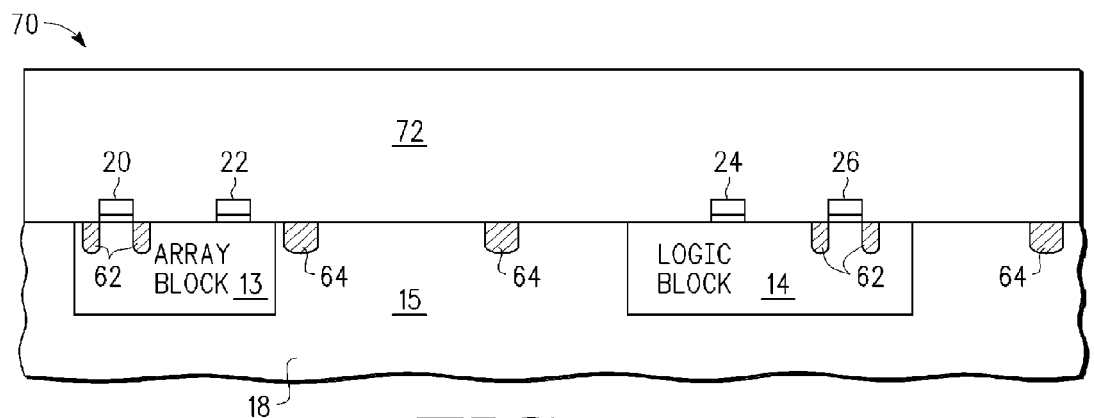
FIG. 7 illustrates processing subsequent to FIG. 6 after the first layer of photoresist is removed and a second layer of photoresist is formed over the semiconductor structure.

To illustrate the implantation of the NMOS transistor features, reference is now made to FIG. 7 which illustrates processing of the semiconductor structure 70 subsequent to FIG. 6 after the first patterned layer of photoresist 32 is removed and a second layer of photoresist 72 is formed over the semiconductor structure. As will be appreciated, the patterned resist layer 32 may be removed using any desired resist strip sequence, such as performing a plasma ash, Pirahna clean and surface clean process. In forming the second layer of photoresist 72 over the semiconductor structure, any desired resist formation process may be used. In an example implementation, the photoresist layer 72 is formed by depositing a layer 72 of photoresist material, such as a photo-sensitive polymer that is responsive to deep ultra-violet (DUV) light, over the semiconductor structure 70.

Figure 8:
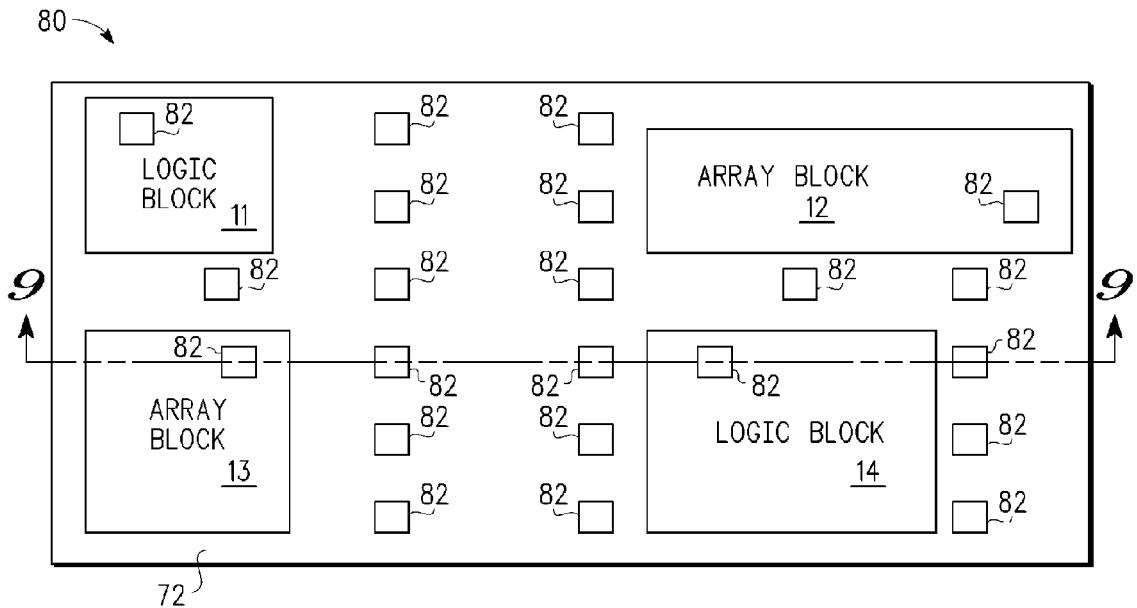
FIG. 8 is a schematic plan view illustrating processing subsequent to FIG. 7 after a second mask pattern is used to form a second plurality of resist openings which are used to expose selected regions in the active circuit areas and in the inactive areas.

A second mask having a desired design of clear and opaque areas may then be positioned atop the photoresist layer 72. This is depicted in FIG. 8 which shows a simplified schematic plan view illustrating processing of the semiconductor structure 80 subsequent to FIG. 7 after a second mask pattern is used to form a second plurality of resist openings 82 over the active circuit areas 11-14 and the inactive areas 15. As compared to the first mask pattern shown in FIG. 4, the resist openings 82 may be formed in different regions within each of the active circuit areas 11-14 when different types of devices (e.g., NMOS devices) are to be implanted through the resist openings 82. As for the resist openings 82 shown as formed over the inactive areas 15, the number and size of such openings is chosen to control the amount of resist coverage over the semiconductor structure 80 so that the total amount of resist coverage is at or below a threshold coverage level, such as 90 percent in selected embodiments, and more particularly 95 percent coverage in other embodiments. The openings 82 may be formed so as to not be co-located over the implanted regions 64, but it will be appreciated that the openings 82 may be formed anywhere over the inactive areas 15, even if co-located over the implanted regions 64. Whatever threshold coverage level is used, the number and size of the resist openings over the inactive areas 15 will depend on how many resist openings are formed over the active circuit areas 11-14. Thus, it will be appreciated that the resist openings 82 depicted in FIG. 8 are not intended to show an actual resist coverage percentage, but are instead provided for illustration purposes.

Figure 9:
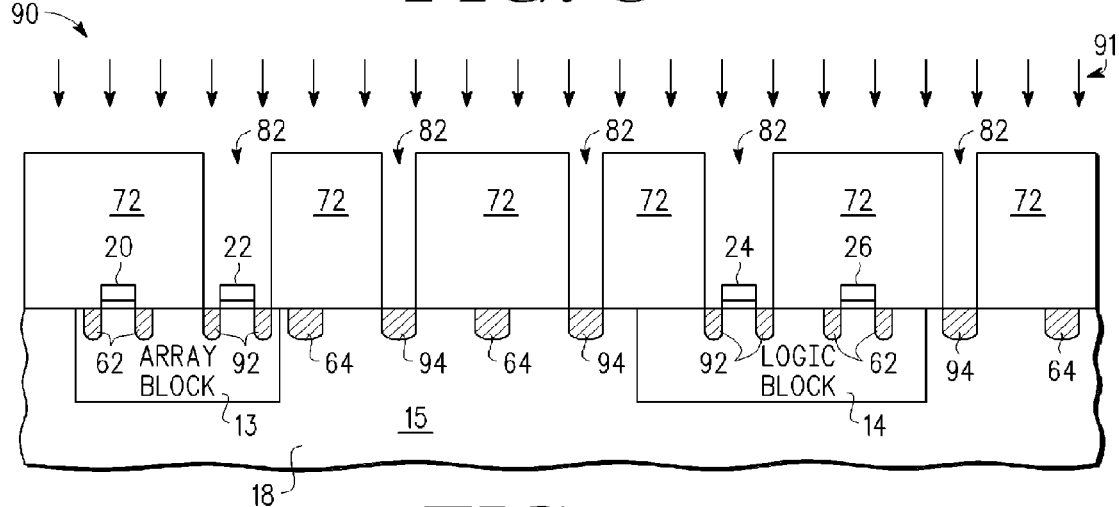
FIG. 9 illustrates processing subsequent to FIG. 8 where a second implant forms a second plurality of implant regions in the exposed selected regions.

Using the second mask pattern, a second implant mask is formed for implanting the NMOS transistors by forming resist openings 82 in the resist layer 72 as shown in FIG. 9 which illustrates processing of the semiconductor structure 90 subsequent to FIG. 8 from the vantage of the perspective line labeled "9." Through not shown, there may be a thin implant oxide liner layer formed over the substrate and gate poly layers prior to implantation 91. Because there are resist openings 82 formed over the active circuit areas 13, 14 in alignment with the intended NMOS implant regions, the second implant step 91 forms a second plurality of implanted regions 92 in the exposed selected regions associated with the etched NMOS gate electrode structures 22, 24. However, the patterned resist layer 72 also includes additional resist openings 82 formed over the inactive or street areas 15. These additional resist openings increase the amount of open area in the resist layer, thereby reducing the buildup of surface charge on the resist layer 72. The additional resist openings also reduce the chance of electrostatic discharge that would be caused by accumulation of charge on the resist layer during plasma-based etching of the resist. With the patterned resist layer 72 in place, the second implantation process 91 simultaneously forms a second plurality of doped regions in the exposed selected regions, as shown in FIG. 9. In particular, the second implant process 91 implants the source/drain regions 92 (e.g., halo regions and/or shallow extension regions) and gate electrode structures 22, 24 in the exposed first and second circuit areas 13, 14 using conventional implanting processes to implant ions having a predetermined conductivity type. For example, when NMOS transistors are fabricated in the first or second circuit areas 13, 14, the gate electrode structures 22, 24 and extension source/drain regions 92 are simultaneously implanted 91 with boron, though other dopants could be used, such as arsenic or phosphorus. Again, the initial source/drain implantation 91 may be used to implant the etched gate electrode structures 22, 24 and source/drain regions 92 in the active circuit areas 13, 14 through a thin sidewall spacer and/or liner oxide (not shown) formed on the etched gate stack structures 22, 24 and exposed substrate regions. At the same time the source/drain regions 92 are implanted, the second implant process 91 implants the exposed regions 94 in the exposed inactive areas 15, thereby providing charge dissipation paths for any accumulated charge on the surface of the patterned resist layer 72.

Figure 10:
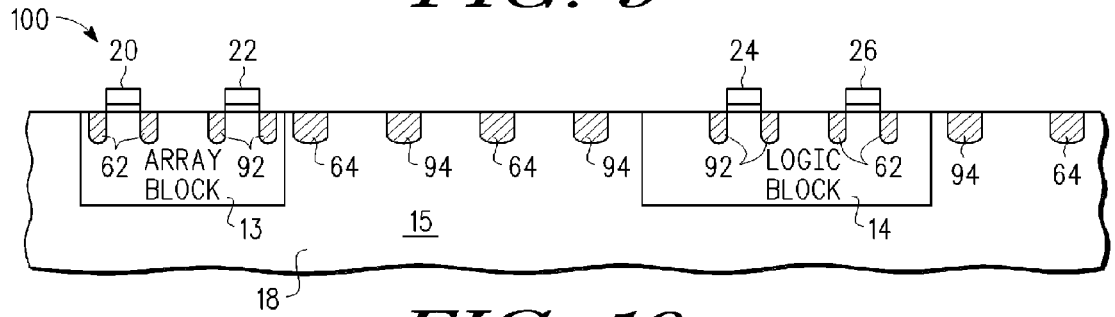
FIG. 10 illustrates processing subsequent to FIG. 9 after the second layer of photoresist is removed.

At this point in the fabrication process, the remnants of the second patterned resist layer 72 must be removed before performing additional processing, as illustrated in FIG. 10 which depicts processing of the semiconductor structure 100 subsequent to FIG. 9 after the second patterned resist layer 72 is removed. If a plasma-based etch or ash process is used to remove the resist layer 72, the presence of the additional resist openings 82 formed over the inactive area 15 and the exposed implanted regions 94 (as shown in FIG. 9) help reduce plasma-induced damage by reducing the total amount of resist coverage below a threshold coverage level, and otherwise providing additional charge dissipation structures for removing charge to prevent or reduce charge build-up.

Figure 11:
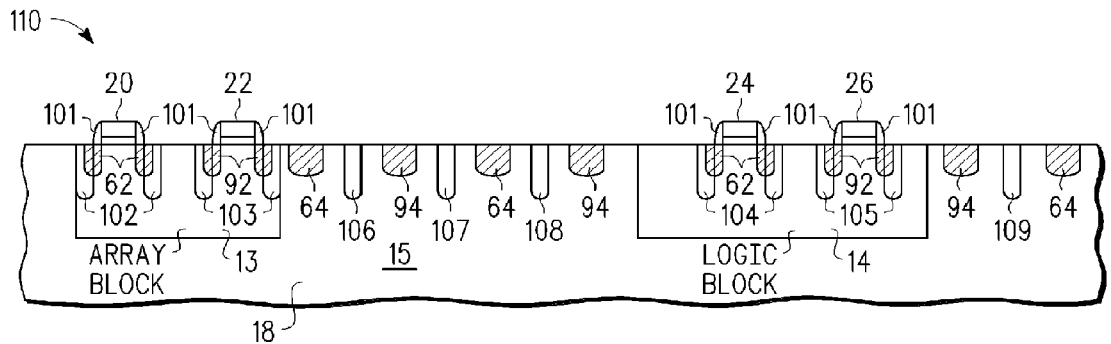
FIG. 11 illustrates processing subsequent to FIG. 10 after additional source/drain implants are formed around sidewall spacers formed on the etched semiconductor layers in the active circuit areas.

As shown with reference to the example embodiments depicted in FIGS. 1-10, selected embodiments of the present invention may be used as part of the front end processing that is used to form the lightly doped or extension source/drain regions by applying photoresist patterns to control the amount of resist coverage over the semiconductor structure. As will be appreciated, these same techniques may be applied when forming the deep N+ and P+ source/drain regions or when implanting other regions or transistor device features as part of the front end processing. However, for deep source/drain implantation processes, improved discharge protection may be obtained by patterning resist openings so that the total resist coverage over the semiconductor structure is at or below 90 percent coverage (e.g., the open area percentage may very often be >10% threshold). For example, FIG. 11 illustrates processing of the semiconductor structure 110 subsequent to FIG. 10 after additional source/drain implant regions 102-105 are formed around sidewall spacers 101 formed on the etched gate stack structures 20, 22, 24, 26 in the active circuit areas in the substrate 18. This processing starts by removing the patterned resist layer 72, and then forms sidewall spacers 101 using any desired process, such as growing or depositing a dielectric layer (e.g., oxide and/or nitride) and then anisotropically etching the deposited dielectric layer to form sidewall spacers 101 on the sidewalls of the etched gate stack structures 20, 22, 24, 26. Subsequently, resist layers are deposited, exposed and developed to form patterned resist layers as implant masks with openings over the intended implantation regions. Though not explicitly shown, the patterned resist used for an implant mask when forming the P+ source/drain regions 102, 105 would include additional resist openings that expose a first group of implant regions 106, 107 in the inactive area 15. Likewise, the patterned resist (not shown) used for an implant mask when forming the N+ source/drain regions 103, 104 would include additional resist openings that expose a second group of implant regions 108, 109 in the inactive area 15. It will be appreciated that the additional resist openings 106-109 could be positioned separately from one another (as shown in FIG. 11), or they could be co-located with the previously formed implant regions 64, 94, or they could be co-located over one another.

In addition to using additional resist openings to control plasma-induced damage in the front end processing, these same techniques may be applied during back end processing when conductive interconnect structures are formed. Examples of such interconnect structures include copper interconnect metallization layers formed with inlaid processing, aluminum interconnect metallization layers, aluminum interconnect metallization layers with tungsten vias, etc. To illustrate an example implantation in a back end process which forms copper interconnect metallization layers with inlaid processing, reference is now made to FIG. 12 which illustrates processing of a semiconductor structure 120 subsequent to FIG. 11 after forming one or more isolation dielectric layers 111, 112 and a resist or mask layer 114 over the semiconductor structure. As illustrated, a planarized first interlayer dielectric layer (ILD0) 112 formed over the semiconductor structure, such as by depositing a layer of silicon nitride 111 to a predetermined thickness (e.g., 500 Angstroms). In addition or in the alternative, a layer of plasma enhanced TEOS 112 may be deposited to a predetermined thickness (e.g., 6000-8000 Angstroms). After preparing the isolation dielectric layer 112 (e.g., with a polishing and/or cleaning process), a planarized resist layer 114 is formed over the semiconductor structure 120 using any desired resist formation process, such as depositing a DUV photoresist layer 114.

Figure 12:
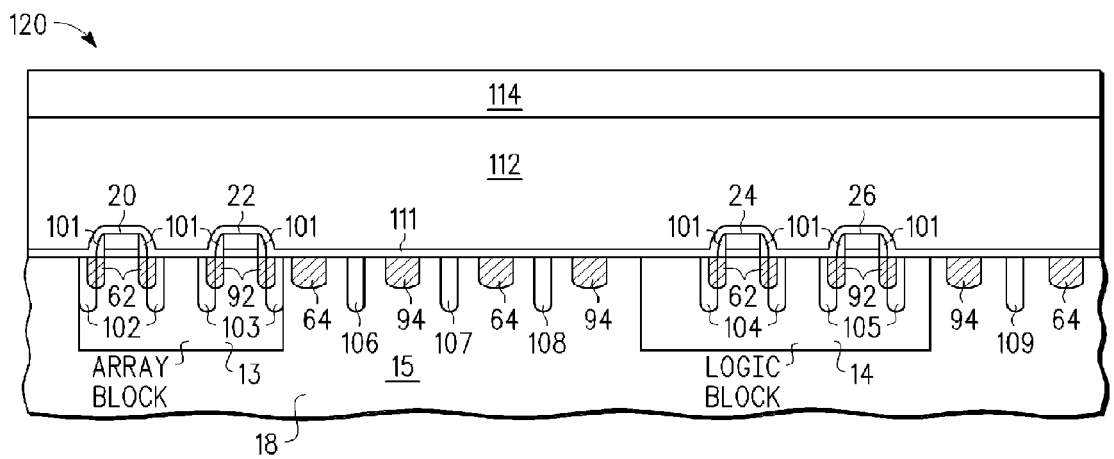
FIG. 12 illustrates processing subsequent to FIG. 11 after forming one or more isolation dielectric layers and a resist or mask layer over the semiconductor structure.
Figure 13:
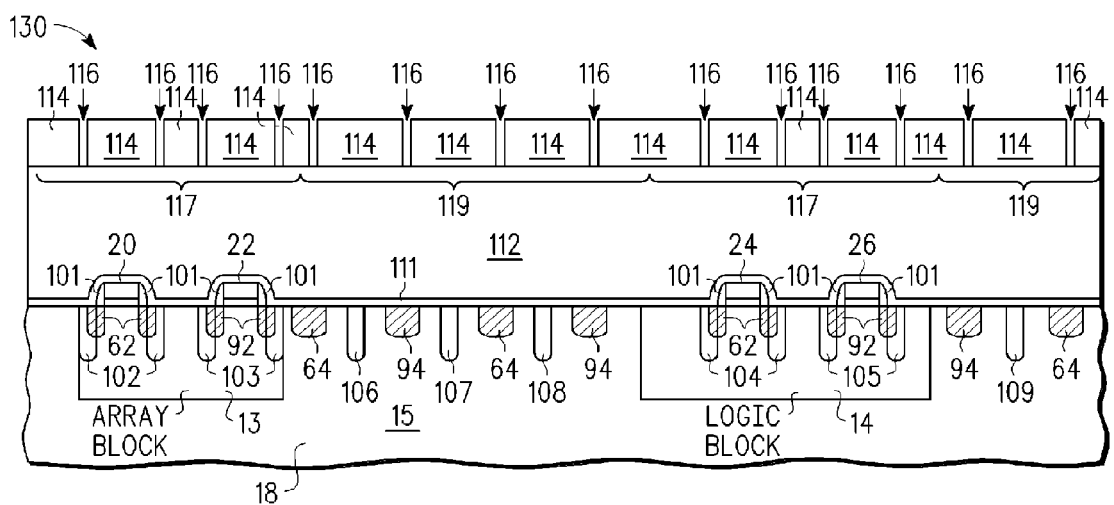
FIG. 13 illustrates processing subsequent to FIG. 12 after a contact mask pattern is used to form a plurality of resist openings in the resist or mask layer over the active circuit areas and the inactive areas.

The resist layer 114 is then patterned with a contact photolithography process as shown in FIG. 13 which illustrates processing of a semiconductor structure 130 subsequent to FIG. 12 after a contact mask pattern is used to form a plurality of resist openings 116 in the resist or mask layer 114. In particular, the resist layer 114 is exposed and developed to form resist openings 117 that expose selected regions of the isolation dielectric layer 112 in the active circuit areas 13, 14, and to also form resist openings 119 that expose selected regions of the isolation dielectric layer 112 in the inactive areas 15.

Figure 14:
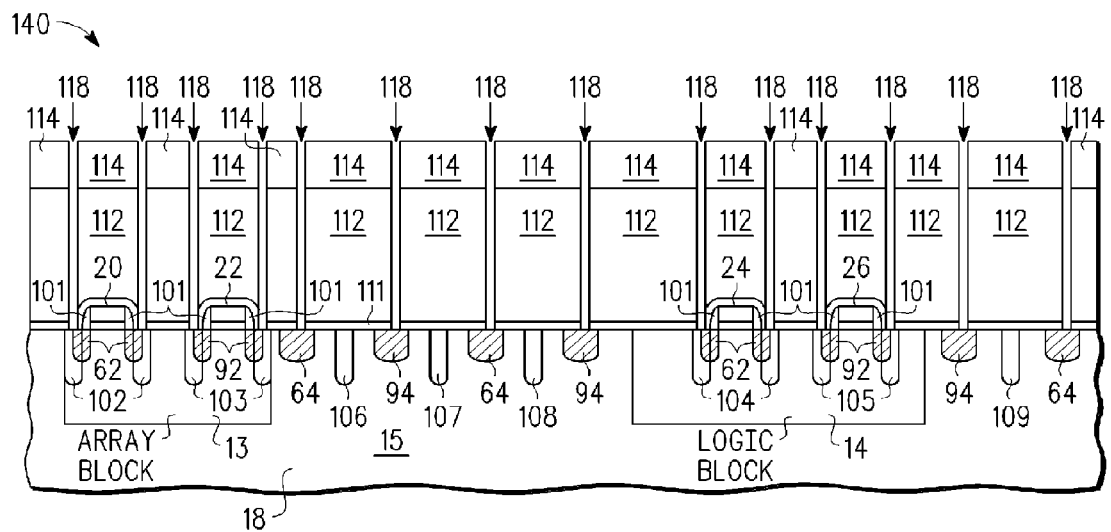
FIG. 14 illustrates processing subsequent to FIG. 13 after a plasma-based etch process is applied which uses the plurality of resist openings to etch through the one or more isolation dielectric layers, thereby exposing at least part of the implant regions in the active circuit areas and in the inactive areas.

With the patterned resist layer 114 in place, a selective etch process is applied to selectively etch or remove portions of the isolation dielectric layers 111, 112 to form contact openings 118 that expose one or more contact regions in the substrate layer 18. The results of the selective etch process is depicted in FIG. 14 which illustrates processing of the semiconductor structure 140 subsequent to FIG. 13 after a selective etch process is applied which uses the plurality of resist openings 116 (shown in FIG. 13) to etch through the one or more isolation dielectric layers 111, 112. Any desired selective etching techniques may be used to form the opening(s) 118 through the isolation dielectric layers 111, 112, including a plasma-based anisotropic dry etching process (such as reactive-ion etching, ion beam etching, or other plasma etching), a laser etching process, a wet etching process wherein a chemical etchant is employed, or any combination thereof. Whichever selective etch process is used, the resulting openings 118 expose at least part of the doped regions in the active circuit areas (e.g., 62/102 and 92/103) as well as some or all of the implanted regions in the scribe inactive areas (e.g., 64, 94). If at this point in the fabrication process a plasma-based etch or ash process is used to form the openings 118, the presence of the additional openings 118 in the resist layer 114 formed over the inactive area 15, as well as the exposed implanted regions (e.g., 64, 94), help reduce plasma-induced damage by reducing the total amount of resist coverage below a threshold coverage level, and otherwise providing additional charge dissipation structures for removing charge to prevent or reduce charge build-up.

Figure 15:
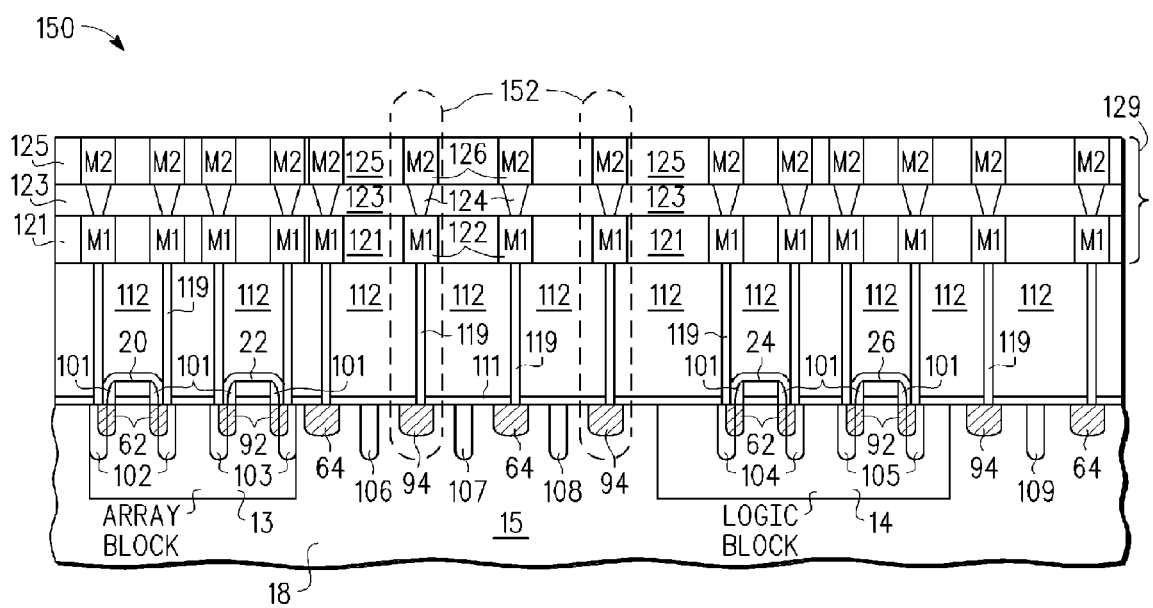
FIG. 15 illustrates processing subsequent to FIG. 14 after one or more interconnect layers are formed over the semiconductor structure so that conductive tiling layers are formed in electrical contact with the doped regions formed in the inactive areas.

There are other examples of back end processing where selected embodiments of the present invention may be applied. For example, FIG. 15 illustrates processing of a semiconductor structure 150 subsequent to FIG. 14 after contact plugs 119 and interconnect layers 129 are formed in electrical contact with the source/drain regions (e.g., 62/102 and 92/103) and the implanted regions (e.g., 64, 94) formed in the inactive areas 15. By forming contact plugs in the contact openings 118 so as to be electrically connected to the implanted regions (e.g., 64, 94) formed in the inactive areas 15, conductive tiling layers are provided which help dissipate charge that can otherwise build up when plasma-based processing steps are used in subsequently forming the interconnect layers 129. One example of a subsequent processing step is when a planarized second interlayer dielectric layer (ILD1) 121 is deposited and selectively etched to form M1 openings into which the first metal M1 structures 122 are subsequently formed. When etching the second interlayer dielectric layer 121, a patterned M1 resist or mask layer (not shown) is used for an etch mask which includes resist openings which define the M1 openings over the active circuit areas 13, 14. In addition, the patterned M1 mask layer includes additional resist openings which define the M1 openings that are aligned to expose the contact plugs 119 in the inactive area 15 when the second interlayer dielectric layer (ILD1) 121 is etched. With the present invention, the patterned M1 mask controls the number of additional resist openings so that the total amount of resist coverage is at or below a threshold coverage level. And by forming first metal structures M1 122 in the M1 openings so as to be electrically connected to the contact plugs 119 formed in the inactive areas 15, additional conductive tiling layers are provided which help dissipate charge that can otherwise build up when plasma-based processing steps are used in forming the subsequent interconnect layers 129.

In similar fashion, a patterned via resist/mask (not shown) is used for an etch mask when selectively etching a deposited third interlayer dielectric layer (ILD1) 123 to form via openings into which via structures 124 are subsequently formed. The patterned via resist/mask includes resist openings which define the via openings in the third interlayer dielectric layer 123 that are aligned to expose the first metal structures M1 over the active circuit areas 13, 14, as well as the metal structures M1 over the inactive circuit areas 15. Again, the patterned via resist/mask may be designed to control the number of additional resist openings so that the total amount of resist coverage is at or below a threshold coverage level. And by forming via structures 124 in the via openings so as to be electrically connected to the underlying metal structures M1 122 formed in the inactive areas 15, additional conductive tiling layers are provided which help dissipate charge that can otherwise build up when plasma-based processing steps are used in forming the subsequent interconnect layers 129.

Using the techniques described herein, the formation of the second metal structures M2 126 in the fourth interlayer dielectric layer 125, as well as any subsequent via or metal structures, may use a patterned resist/mask that is designed to control the number of additional resist openings so that the total amount of resist coverage is at or below a threshold coverage level. By forming second (and subsequent) metal and via structures in the interconnect layers 129 so as to be electrically connected to the underlying metal structures M1 122 formed in the inactive areas 15, additional conductive tiling layers are provided which help dissipate charge that can otherwise build up when plasma-based processing steps are used. Together, the conductive tiling layers form charge dissipation structures (152) which are built up through the course of fabricating the final structure and used to dissipate or direct charge into the inactive circuit area.

While FIGS. 12-15 illustrate back end of line interconnect structures being patterned and formed over the inactive circuit areas, those skilled in the art will appreciate that this is not necessarily required. In selected embodiments, at least part of the additional charge dissipation structures formed during back end processing may be patterned and formed over the active circuit areas in one or more of the interconnect layers.

It will be appreciated that additional processing steps will be used to fabricate additional circuit features on the semiconductor structure, such as transistor devices. As examples, one or more sacrificial oxide formation, stripping, isolation region formation, well region formation, gate dielectric and electrode formation, extension implant, halo implant, spacer formation, source/drain implant, heat drive or anneal steps, and polishing steps may be performed, along with conventional backend processing, typically including formation of multiple levels of interconnect that are used to connect the transistors in a desired manner to achieve the desired functionality. Thus, the specific sequence of steps used to complete the fabrication of the semiconductor structures may vary, depending on the process and/or design requirements.

Figure 16:
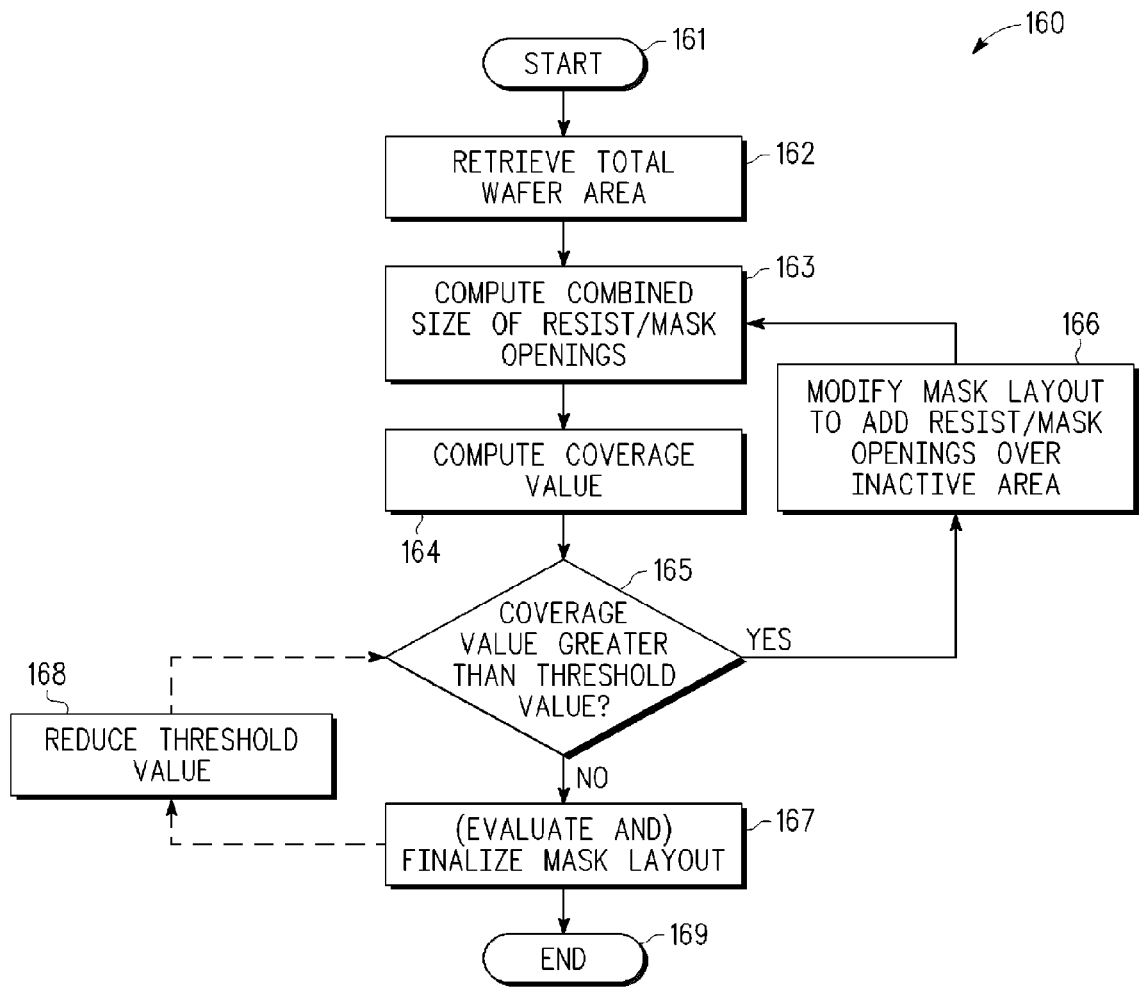
FIG. 16 depicts a flowchart for an exemplary method for generating a resist or mask pattern to control the amount of resist coverage over a semiconductor structure below a threshold coverage level.

Selected embodiments of the present invention may also be illustrated with reference to FIG. 16, which depicts a flowchart 160 for an exemplary method for generating a resist or mask pattern to control the amount of resist coverage over a semiconductor structure below a threshold coverage level. As depicted, once the pattern design process starts (step 161), the total wafer area is retrieved (step 162) to determine the total resist area that would be covered if no resist openings were formed. In addition, the combined size of the required resist/mask openings in the active circuit areas is computed (step 163). The combined size of the required resist/mask openings may be computed for a particular processing step by first extracting information from the circuit's finalized plot information or from the mask layout information for the total combined resist/mask open areas in the active circuit areas. Next, a coverage value may be computed which specifies what percentage of the total wafer area is covered by the resist/mask (step 164). For example, the computation may be performed by subtracting the combined size of the required resist/mask openings in the active circuit areas from the total wafer area and then dividing the difference by the total wafer area. If the coverage value is above a predetermined threshold value (affirmative outcome to decision 165), the mask layout information is modified (step 166) to include an additional resist/mask opening of a predetermined size, where the additional resist/mask opening is positioned over the inactive or street areas (e.g., outside of the active circuit areas). The process then reverts to step 163 where the combined size of the required resist/mask openings is computed for a particular processing step by extracting information from the circuit's finalized plot information or from the mask layout information for the total combined resist/mask open areas in the active and inactive circuit areas. In this way, the process is repeated so that additional resist/mask openings continue to be added in the inactive area until the coverage value is at or below the predetermined threshold value (negative outcome to decision 165), at which point the mask layout is finalized (step 167) and the design process concludes (step 169).

This processes described herein can be applied in a design for manufacturing (DFM) design process to provide multiple levels of threshold values that are needed for different levels of robustness. Additional analysis may also be performed to obtain different levels of threshold values in different components of the circuit that may be needed due to different levels of sensitivity to plasma damage. For example, different levels of threshold coverage values (e.g., 95%, 90% 80%, 75%) could be sequentially applied in an iterative design process in order to obtain the lowest achievable coverage value that can be reconciled with the other circuit and layout requirements which would set the limit on how low the coverage threshold can go. An example iterative process is illustrated in FIG. 16 with reference to the evaluation step 167 wherein the mask layout would be evaluated against one or more trade-off design considerations (e.g., layout constraints, implant uniformity, resist penetration, etc.) to determine if a lower coverage could be used for the design. If so, the threshold value could be reduced (step 168) so that the process is repeated until the revised mask layout no longer meets the evaluation requirements (from step 167), in which case the lowest coverage mask layout that is successfully evaluated is finalized. Of course, the iterative process may instead start by reducing the threshold value and then modifying the mask layout until the computed coverage value is below the reduced threshold value, and only subsequently evaluated to determine if the revised mask layout meets the evaluation requirements. With either approach, a higher coverage threshold would be hit first, and then as far as possible, attempts may be made to get to a lower threshold, thereby reducing the probability of electrostatic discharge damage. In addition or in the alternative, the processes described herein may be differentially applied to different blocks or areas on a chip to provide different coverage levels for the different circuit blocks or areas. For example, an analog circuit block could require less coverage than a digital circuit block, in which case different threshold coverage values could be specified for the different circuit blocks so that blocks with more sensitive circuits would have a lower coverage threshold than blocks deemed less sensitive or critical.

By now it should be appreciated that there has been provided a method for fabricating a semiconductor structure. As disclosed, a layer of photoresist is applied over a substrate to cover both an active circuit area and an inactive circuit area. The layer of photoresist is then patterned to define a first group of photoresist openings over the active circuit area and a second group of photoresist openings over the inactive circuit area. The first and second groups of photoresist openings together define a total resist coverage percentage for the semiconductor structure that is at or below a predetermined threshold coverage level that is selected to reduce electrostatic discharge into the active circuit area through the first group of photoresist openings. For example, the total resist coverage percentage may be selected to be 90 percent resist coverage, 95 percent resist coverage, or any other resist coverage percentage that reduces electrostatic discharge. For example, the first group of photoresist openings over the active circuit area are not alone sufficient to provide the predetermined threshold coverage level, but by combining the second group of photoresist openings with the first group of photoresist openings, the predetermined threshold coverage level is met. In selected embodiments, the patterned photoresist layer forms an implant mask having first and second groups of photoresist openings, where the first group of photoresist openings defines a first group of implant substrate regions in the active circuit area, and where the second group of photoresist openings defines a second group of implant substrate regions in the inactive circuit area to be implanted. With the implant mask in place, ions having the first predetermined conductivity type are implanted through the first and second groups of photoresist openings in the first implant mask and into the substrate, thereby forming the first group of implant substrate regions in the active circuit area and the second group of implant substrate regions in the inactive circuit area. In other embodiments, the patterned photoresist layer forms a first etch mask where the first group of photoresist openings defines a first group of etch openings in an underlying layer to be etched with a plasma-based etch process, and where the second group of photoresist openings to defines a second group of etch openings in the underlying layer to be etched with the plasma-based etch process. With the etch implant mask in place over an underlying layer, a plasma-based etch process is applied, thereby forming the first group of etch openings in the underlying layer over the active circuit area and the second group of etch openings in the underlying layer over the inactive circuit area. In the second group of etch openings in the underlying layer, the plasma-based etch process exposes previously-formed conductive tiling layers that may be formed from an aluminum or silicon based material. By forming and exposing the conductive tiling layers below the second group of etch openings in the underlying layer over the inactive circuit, the conductive tiling layers are disposed to direct charge from the inactive circuit area.

In another form, there is provided a method and system for forming a semiconductor structure. In the disclosed methodology, a semiconductor structure is provided which has one or more active circuit areas and one or more inactive areas formed therein. After a photoresist layer is deposited over a coverage area of the semiconductor structure, a plurality of openings is formed in the photoresist layer over the active and inactive areas. This may be done by patterning the photoresist layer to form a patterned photoresist structure having a first group of photoresist openings over the one or more active circuit areas and a second group of photoresist openings over the one or more inactive areas. As formed, the second group of photoresist openings exposes a conductive layer, semiconductor layer or thin insulator layer (e.g., a screen oxide layer less than approximately 100 Angstroms) on the semiconductor structure. The openings expose at least a predetermined threshold percentage of the semiconductor structure in the coverage area, where the predetermined threshold percentage is selected to reduce electrostatic discharge through openings in the photoresist layer and into the one or more active circuit areas. When performing a relatively low energy plasma-based implantation process (e.g., LDD source/drain implantation), the photoresist is patterned to define a first group of photoresist openings over the active circuit areas and a second group of photoresist openings over the inactive areas, where the first and second groups of photoresist openings together expose at least a predetermined threshold percentage of five percent of the semiconductor structure in the coverage area. However, when performing a relatively high energy plasma-based implantation process (e.g., deep source/drain implantation), the photoresist is patterned to define the first and second groups of photoresist openings so that they, together, expose at least a predetermined threshold percentage of ten percent of the semiconductor structure in the coverage area. As a result, a subsequent plasma-based process (e.g., a plasma-based etch, ash, or implantation process) that is performed on the semiconductor structure takes advantage of charge dissipation structures formed in the openings over the inactive areas to dissipate charge from the photoresist layer.

In yet another form, there is provided a method and system for forming a semiconductor structure to reduce electrostatic discharge damage during plasma processing. As a preliminary step, a photoresist layer is formed over a semiconductor structure in which one or more active circuit regions and one or more inactive regions are formed. Subsequently, a photoresist pattern is applied to control resist coverage over the semiconductor structure so that a total amount of resist coverage over the semiconductor structure is at or below a predetermined threshold coverage level which is selected to prevent electrostatic discharge damage from a plasma process. In selected embodiments, the photoresist pattern is applied by defining the photoresist pattern so that the total amount of resist coverage over the semiconductor structure is at or below a predetermined threshold coverage level of between ninety and ninety-five percent. Using the photoresist pattern, a plurality of implant openings is created in the photoresist layer to expose a plurality of areas in the active circuit regions and one or more active tiles formed in the inactive regions of the semiconductor structure. Through these implant openings, ions are implanted using a plasma-based implantation process.

In still yet another form, there is provided a method for designing a patterned photoresist layer for at least a circuit block of a wafer. As a preliminary step, a coverage value is computed for a mask layout that is used to pattern a photoresist layer on at least a circuit block of a wafer. The computation of the coverage value is based at least in part on an area computation for all openings defined in the mask layout. If the computed coverage value is at or below a predetermined coverage threshold value, a modified mask layout is generated to include one or more additional openings located over one or more inactive circuit areas, and then the coverage value is re-computed for the modified mask layout based on an area computation for all openings defined in the mask layout. This process continues until the coverage value is at or below a predetermined coverage threshold value. In addition, the computing and generating steps may be iteratively repeated after reducing the predetermined coverage threshold value until a modified mask layout is generated that meets a predetermined design limit, such as a layout constraint, an implant uniformity requirement, or a resist penetration requirement. Once the modified mask layout is completed to include one or more additional openings located over one or more inactive circuit areas, the modified mask layout is used to manufacture an integrated circuit.

Although the described exemplary embodiments disclosed herein are directed to various semiconductor device structures and methods for making same, the present invention is not necessarily limited to the example embodiments which illustrate inventive aspects of the present invention that are applicable to a wide variety of semiconductor processes and/or devices. Thus, the particular embodiments disclosed above are illustrative only and should not be taken as limitations upon the present invention, as the invention may be modified and practiced in different but equivalent manners apparent to those skilled in the art having the benefit of the teachings herein. For example, different plasma-based processes may be used than disclosed herein. Moreover, the dimensions of the described layers may deviate from the disclosed dimension values. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for designing a patterned photoresist layer for at least a first circuit block of a wafer, the method comprising:

computing a coverage value for a mask layout used to pattern a photoresist layer on at least a first circuit block of a wafer based on an area computation for all openings defined in the mask layout; and generating a modified mask layout to include one or more additional openings located over one or more inactive circuit areas and re-computing the coverage value for the modified mask layout based on an area computation for all openings defined in the mask layout until the coverage value is at or below a first predetermined coverage threshold value.

2. The method of claim 1, further comprising iteratively repeating the computing and generating steps after reducing the first predetermined coverage threshold value until a modified mask layout is generated that meets a predetermined design limit.

3. The method of claim 2, where the predetermined design limit comprises a layout constraint, an implant uniformity requirement, or a resist penetration requirement.

4. The method of claim 2, further comprising designing the patterned photoresist layer for a second circuit block of a wafer, comprising:

computing a second coverage value for the mask layout used to pattern the photoresist layer on the second circuit block of the wafer; and generating a modified mask layout to include one or more additional openings located over one or more inactive circuit areas in the second circuit block and re-computing the second coverage value for the modified mask layout based on an area computation for all openings defined in the mask layout until the second coverage value is at or below a second predetermined coverage threshold value which is different from the first predetermined coverage threshold value.

5. The method of claim 4, where the first predetermined coverage threshold value is used to generate the modified mask layout for a digital circuit block, and where the second predetermined coverage threshold value is used to generate the modified mask layout for an analog circuit block, such that the second predetermined coverage threshold value is less than the first predetermined coverage threshold value.

6. The method of claim 1, further comprising manufacturing an integrated circuit using the modified mask layout which includes the one or more additional openings located over one or more inactive circuit areas.

* * * * *